US011029364B2

(12) United States Patent
Meyer

(10) Patent No.: US 11,029,364 B2
(45) Date of Patent: Jun. 8, 2021

(54) METHOD AND ARRANGEMENT FOR DETERMINING THE STATE OF CHARGE AND THE STATE OF HEALTH OF AN ELECTRICAL ENERGY STORE

(71) Applicant: Rolls-Royce Deutschland Ltd & Co KG, Blankenfelde-Mahlow (DE)

(72) Inventor: Andreas Meyer, Wendelstein (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 90 days.

(21) Appl. No.: 16/481,747

(22) PCT Filed: Dec. 18, 2017

(86) PCT No.: PCT/EP2017/083327
§ 371 (c)(1),
(2) Date: Jul. 29, 2019

(87) PCT Pub. No.: WO2018/141452
PCT Pub. Date: Aug. 9, 2018

(65) Prior Publication Data
US 2019/0391211 A1  Dec. 26, 2019

(30) Foreign Application Priority Data
Jan. 31, 2017 (DE) ..................... 10 2017 201 485.7

(51) Int. Cl.
*G06F 11/30* (2006.01)
*G01R 31/392* (2019.01)
(Continued)

(52) U.S. Cl.
CPC ....... *G01R 31/392* (2019.01); *G01R 31/3842* (2019.01); *G06F 30/20* (2020.01)

(58) Field of Classification Search
CPC .................................................. G01R 31/392
See application file for complete search history.

(56) References Cited

U.S. PATENT DOCUMENTS

2002/0169581 A1*  11/2002  Sarfert ................. G01R 31/367
702/182
2014/0188415 A1    7/2014  Kelly
(Continued)

FOREIGN PATENT DOCUMENTS

CN        102866362 A      1/2013
CN        103884995 A      6/2014
(Continued)

OTHER PUBLICATIONS

German Search Report for German Application No. 10 2017 201 485.7 dated Nov. 24, 2017.
(Continued)

*Primary Examiner* — Phuong Huynh
(74) *Attorney, Agent, or Firm* — Lempia Summerfield Katz LLC

(57) ABSTRACT

In order to determine the charging capacity state and the state of health of an electrical energy store of a battery system (BS1; BS2) with little effort, a measuring device (ME) is proposed, which measuring device injects, into a drive train which is available for first or second loads (VR1; VR2) and has an AC/DC converter (ADC) or a DC/DC controller (DDC) on the DC side of the AC/DC converter (ADC) or of the DC/DC controller (DDC), a sinusoidal voltage harmonic with a varied frequency or a sinusoidal current with a varied frequency as a particular measurement signal which is transmitted to the battery system (BS1; BS2). The current response or voltage response, which has been purged of unwanted influences, is then determined for each measurement signal at the battery system (BS1; BS2), from which response phase shifts are determined in each case, and parameters for a statement relating to the charging capacity state or the state of health of the battery system (BS1; BS2) are in turn determined therefrom.

17 Claims, 1 Drawing Sheet

(51) Int. Cl.
*G01R 31/3842* (2019.01)
*G06F 30/20* (2020.01)

(56) References Cited

U.S. PATENT DOCUMENTS

2015/0008929 A1* 1/2015 Ehrmann ................ B60L 58/12
324/426
2015/0070024 A1* 3/2015 Kim ...................... H01M 10/48
324/430

FOREIGN PATENT DOCUMENTS

| | | |
|---|---|---|
| CN | 104015626 A | 9/2014 |
| CN | 106253358 A | 12/2016 |
| DE | 10106505 A1 | 8/2002 |
| DE | 102009009954 A1 | 8/2010 |
| DE | 102011087678 A1 | 6/2013 |

OTHER PUBLICATIONS

PCT International Search Report and Written Opinion of International Searching Authority dated Apr. 30, 2018 corresponding to PCT International Application No. PCT/EP2017/083327 filed Dec. 18, 2017.
Chinese Office Action for Chinese Application No. 201780085239.5 dated Dec. 2, 2020, with English translation.

\* cited by examiner

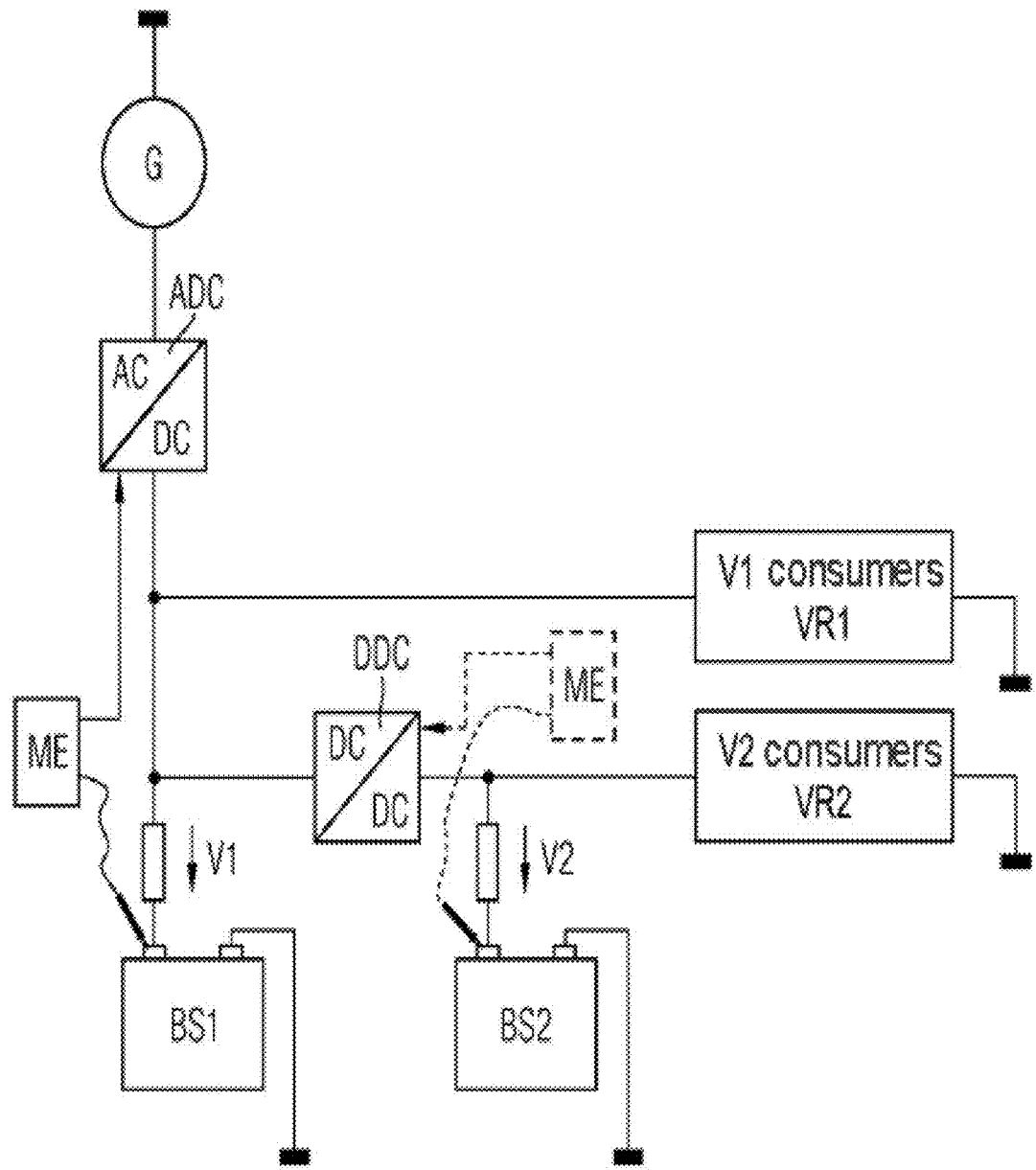

METHOD AND ARRANGEMENT FOR DETERMINING THE STATE OF CHARGE AND THE STATE OF HEALTH OF AN ELECTRICAL ENERGY STORE

RELATED CASE

The present patent document is a § 371 nationalization of PCT Application Serial Number PCT/EP2017/083327, filed Dec. 18, 2017, and also claims the benefit of DE Application Serial No. 10 2017 201 485.7, filed Jan. 31, 2017, which are hereby incorporated by reference.

BACKGROUND

The present embodiments to a method and to an arrangement for determining the state of charge and the state of health of an electrical energy store.

It is complicated to determine the state of charge (SOC) and the state of health (SOH) of an energy store, for example a battery such as, for example, a lithium battery having one or more cells, during use in the field. The common methods for this are costly and deliver only inaccurate results. The time outlay for performing the measurements is significant and the actual operating process is impaired.

The SOC and the SOH of the battery, wherein battery stands for a battery as such, for an energy store as such, or for a battery system, that is to say for a battery or for an energy store having units for control and regulation of energy supply and removal, are determined during operation by what are known as state estimators. A state estimator has a prescribed battery model stored as a basis for its operation. Said model has to be readjusted after some time on account of aging processes in the cells of the battery due to changed charging capacity and resistance parameters. This requires certain measurement series, which are detected by an external, highly accurate battery charging device with measurement value recording. The charging capacity and resistance parameters for the relevant battery are determined anew by correspondingly evaluating the measurement series.

The SOH is determined by a very slow charging and discharging cycle. Document DE 101 06 505 A1 discloses by way of example a corresponding method for this purpose.

Another possibility of determining the present charging capacity and resistance parameters of the cells is impedance spectroscopy, that is to say determining the AC resistance or the impedance. For this method, as in the method mentioned above, an external device must be connected, in this case an impedance measurement device. By way of said measurements, the resistances can be measured and the charging capacity of the battery can be inferred by correlation to the aging. The outlay, particularly for the measurement device, is high.

SUMMARY

It is the object of the present embodiments to specify a method and an arrangement for determining the SOC and the SOH of an electrical energy store where the method and arrangement respectively require a lower outlay than previously and function more accurately.

The method according to one embodiment accordingly includes method acts according to which a measurement circuit is formed between an AC/DC converter or a DC/DC converter and a respectively downstream battery system by virtue of a sinusoidal voltage harmonic with varied frequency or a sinusoidal current with varied frequency being impressed on the DC side of the AC/DC converter or the DC/DC converter as a respective measurement signal. Furthermore, according to the method, the respective measurement signal is transmitted from the AC/DC converter or from the DC/DC converter to the battery system. The current response or the voltage response is ascertained for each measurement signal at the battery system. Capacitances or impedances located outside of the battery system and acting on the measurement circuit are determined in advance. Each current response or each voltage response is adjusted for the effect of the capacitances or impedances determined in advance. An occurring phase shift is ascertained from each adjusted current response or each adjusted voltage response, and parameters for a statement about the SOC or about the SOH of the downstream battery system are derived from the ascertained phase shifts.

In an advantageous refinement, the energy store model or battery model forming the basis for a relevant energy store or a relevant battery is readjusted accordingly using the derived corresponding parameters. As a result, an overall system operating with said energy store or with said battery functions in a simplified manner with an increased degree of accuracy.

The arrangement according to one embodiment has a measurement device, which is connected so as to form a measurement circuit therebetween, on one side to the DC side of the AC/DC converter or the DC/DC converter so as to impress a sinusoidal voltage harmonic with varied frequency or a sinusoidal current with varied frequency as a respective measurement signal. The sinusoidal current or voltage is transmitted to the battery system. The measurement device is connected on the other side to the battery system so as to ascertain a current response or a voltage response for each transmitted measurement signal. In this case, the measurement device is designed for determining in advance capacitances or impedances located outside of the battery system and acting on the measurement circuit, adjusting each current response or each voltage response for the effect of the capacitances or impedances determined in advance, ascertaining an occurring phase shift from each adjusted current response or each adjusted voltage response, and deriving parameters for a statement about the SOC or about the SOH of the energy store of the battery system from the ascertained phase shifts.

The method and the arrangement have the advantage that the battery model can be readjusted to the battery directly. Furthermore, the SOH of the battery can be assessed from the correlation of the resistances. It is therefore possible to always have the correct battery model during operation of the battery. State estimators used operate more accurately and it is possible to dispense with a difficult calculation of the SOH of the battery by way of the state estimator. Impedance measurements are no longer carried out by an external device or device additionally integrated into the drive train but instead by the AC/DC converter or DC/DC converter that is installed anyway. The effectiveness of the SOC and the SOH determination is increased. The costs therefor are reduced because maintenance and removal of the battery or the battery system from running operation are no longer necessary.

When a voltage is impressed on the series circuit of a battery composed of individual cells or individual modules, individual cells can also be measured in a targeted manner by way of individual voltage measurements at the cells. The current response causes different voltage drops at the individual impedances.

The AC/DC converter impresses a sinusoidal current into the drive train, where the battery is connected directly. In order that, for example, the AC/DC converter generates said signal, at least one winding system of a connected motor is required. The inductance of the motor is used to allow the converter to generate the signals. The converter transmits the sinusoidal currents and varies them over a frequency spectrum. The voltage sensors on the converter, on the battery system and on the cells are used to measure the voltage response. It is even possible to measure a cell in a targeted manner by way of the measurements at the cells.

The main focus is on the total resistance of the battery system and on determining the parameters therefor. The resistances can be assigned from the recorded frequency spectrum.

BRIEF DESCRIPTION OF THE DRAWINGS

An exemplary embodiment of the invention is explained in more detail below based on FIG. 1. FIG. 1 shows a basic illustration of an arrangement in accordance with one embodiment.

DETAILED DESCRIPTION OF THE EXEMPLARY EMBODIMENTS

It is noted at this point that the mentioned measurement device ME is not necessarily a separate individual unit independently of the other illustrated components, although this may also be the case in principle. Instead, the measurement device ME is an integral constituent part of the other illustrated components, wherein suitable components already present as such are concomitantly used there.

The arrangement shown in FIG. 1 shows, proceeding from a generator G, a first drive train having an AC/DC converter ADC and a first battery system BS1, wherein a second drive train leads via a DC/DC converter DDC and a second battery system BS2. The respective battery systems BS1 and BS2 are each connected via an equivalent-circuit resistor, to which in each case a first voltage V1 and a second voltage V2 are respectively applied correspondingly. In given cases, the equivalent-circuit resistors could also be real resistors.

First consumers VR1 are supplied with electrical energy at the first voltage V1, and second consumers VR2 are supplied with electrical energy at the second voltage V2. For example, the first voltage could be a 42 V voltage and the second voltage could be a 12 V voltage.

In the present exemplary embodiment, the battery systems BS1 and BS2 have, in addition to an energy store such as, for example, a battery as a core component, further components by way of which even cell impedances, for example, may be measured. In this respect, the batteries constitute battery systems BS1 and BS2, wherein conversely the battery systems BS1 and BS2 may also be composed only of one battery alone. Corresponding required components for forming the arrangement are then to be added. The same holds true, for example, also for the AC/DC converter ADC, which is either already arranged or is to be arranged in such a way that accordingly required signals to be impressed, in particular specific measurement signals, are able to be introduced by said converter. In this respect, the measurement device ME illustrated in the FIGURE is not necessarily a separate unit, as indicated in FIG. 1, but an overall existing device, which is embedded in an initial construct in a different form. The illustration shown in FIG. 1 shows only the basic principle.

It is also noted that a measurement device ME at the same time can be used not only in a single one of the drive trains but in each drive train. In the latter case, it is conceivable that actually only one single measurement device ME is installed but in such a way that it takes measurements in periods alternately for each drive train.

In the specific case according to FIG. 1, two battery systems BS1 and BS2 are used, which are each connected into a drive train. The first battery system BS1 is connected together with an AC/DC converter ADC, and the second battery system BS2 is connected additionally together with a DC/DC converter DDC. The battery systems BS1 and BS2 are located here according to FIG. 1 respectively at a position downstream of the AC/DC converter ADC or DC/DC converter DDC. Exemplary embodiments in which only a single drive train, for example having an AC/DC converter ADC or having a DC/DC converter, is present may be provided.

The first drive train having the AC/DC converter ADC and the first battery system BS1 drives the first consumers VR1. The second drive train having the DC/DC converter DDC and the second battery system BS2 drives the second consumers VR2. At the same time as the driving of the first consumers VR1, the first battery system BS1 or the energy store thereof or the battery thereof is charged. The same applies for the second drive train, in which, at the same time as the driving of the second consumers VR2, the second battery system BS2 or the energy store thereof or the battery thereof is charged. If the AC/DC converter ADC or the DC/DC converter DDC malfunctions, the first battery system BS1 drives the first consumers VR1 or the second battery system BS2 drives the second consumers VR2. The respectively relevant battery system or the energy store thereof or the battery thereof is discharged in this case.

In order to know the present charging capacity or the present SOH of the battery systems and to be able to take measures depending thereon, a measurement device ME is connected, so as to form a measurement circuit therebetween, on one side to the DC side of the AC/DC converter ADC or the DC/DC converter DDC so as to impress a sinusoidal voltage harmonic with varied frequency or a sinusoidal current with varied frequency as a respective measurement signal, which is transmitted to the battery system BS1, BS2, and on the other side to the battery system BS1, BS2 so as to ascertain a current response or a voltage response for each transmitted measurement signal. In this case, the measurement device ME is designed for determining in advance capacitances or impedances located outside of the battery system BS1, BS2 and acting on the measurement circuit, adjusting each current response or each voltage response for the effect of the capacitances or impedances determined in advance, ascertaining an occurring phase shift from each adjusted current response or each adjusted voltage response, and deriving parameters for a statement about the SOC or about the SOH of the battery system BS1, BS2 from the phase shifts.

To determine the SOC and the SOH of an electrical energy store of a battery system, which is connected into an electrical drive train, a measurement circuit is formed between the AC/DC converter ADC or the DC/DC converter DDC and the respectively downstream battery system BS1, BS2 by way of the measurement device ME mentioned above. This is effected by virtue of a sinusoidal voltage harmonic with varied frequency or a sinusoidal current with varied frequency being impressed on the DC side of the AC/DC converter ADC or the DC/DC converter DDC as a respective measurement signal. The respective measurement signal is transmitted from the AC/DC converter ADC or from the DC/DC converter DDC to the battery system BS1, BS2. The current response or the voltage response is then ascertained for each measurement signal at the battery system BS1, BS2. Capacitances or impedances located outside of the battery system BS1, BS2 and acting on the measurement circuit are determined in advance. Each current response or each voltage response is then adjusted for the effect of the capacitances or impedances determined in advance. An occurring phase shift is ascertained from each adjusted current response or each adjusted voltage response, from which phase shifts parameters for a statement about the SOC or about the SOH of the energy store of the downstream battery system BS1, BS2 are derived.

In a further step, a battery model forming the basis for the energy store of the downstream battery system BS1, BS2 is readjusted using the derived parameters.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a state of charge or a state of health of an electrical energy store of a battery system, which is connected into an electrical drive train, which has consumers supplied with electrical energy via an AC/DC converter or a DC/DC converter or the battery system, the method comprising:
   impressing a measurement signal by virtue of a sinusoidal voltage harmonic with varied frequency or a sinusoidal current with varied frequency on a DC side of the AC/DC converter or the DC/DC converter;
   transmitting the measurement signal from the AC/DC converter or from the DC/DC converter to the battery system;
   ascertaining, by a measurement circuit formed between the AC/DC converter or the DC/DC converter and the battery system, a current response or a voltage response for the measurement signal at the battery system;
   adjusting the current response or the voltage response for an effect of capacitances or impedances determined in advance, the capacitances or impedances located outside of the battery system and acting on the measurement circuit;
   ascertaining an occurring phase shift from the adjusted current response or the adjusted voltage response; and
   deriving parameters for a statement about the state of charge or about the state of health of the electrical energy store of the battery system from the ascertained phase shifts.

2. The method of claim 1, further comprising:
   adjusting a battery model forming a basis for the energy store of the battery system using the derived parameters.

3. The method of claim 1, wherein the deriving of the parameters comprises deriving parameters for a statement about the state of charge of the electrical energy store of the battery system.

4. The method of claim 1, wherein the deriving of the parameters comprises deriving parameters for a statement about the state of health of the electrical energy store of the battery system.

5. The method of claim 1, wherein the measurement signal is impressed by virtue of the sinusoidal voltage harmonic with varied frequency.

6. The method of claim 1, wherein the measurement signal is impressed by virtue of the sinusoidal current with varied frequency.

7. The method of claim 1, wherein the current response is ascertained for the measurement signal at the battery system,
   wherein the current response is adjusted for the effect of the capacitances or the impedances determined in advance, and
   wherein the occurring phase shift is ascertained from the adjusted current response.

8. The method of claim 1, wherein the voltage response is ascertained for the measurement signal at the battery system,
   wherein the voltage response is adjusted for the effect of the capacitances or the impedances determined in advance, and
   wherein the occurring phase shift is ascertained from the adjusted voltage response.

9. The method of claim 1, wherein the measurement signal is impressed on the DC side of the AC/DC converter, and
   wherein the measurement signal is transmitted from the AC/DC converter to the battery system.

10. The method of claim 1, wherein the measurement signal is impressed on the DC side of the DC/DC converter, and
    wherein the measurement signal is transmitted from the DC/DC converter to the battery system.

11. An arrangement for determining a state of charge or a state of health of an electrical energy store of a battery system connected to an electrical drive train, the arrangement comprising:
    an AC/DC converter or a DC/DC converter, downstream of which the battery system is connected; and
    a measurement device connected so as to form a measurement circuit, the measurement device connected on one side to a DC side of the AC/DC converter or the DC/DC converter so as to impress a sinusoidal voltage harmonic with varied frequency or a sinusoidal current with varied frequency as a respective measurement signal transmitted to the battery system, and on the other side to the battery system so as to ascertain a current response or a voltage response for each transmitted measurement signal, wherein the measurement device is configured to:
       determine in advance capacitances or impedances located outside of the battery system and acting on the measurement circuit;
       adjust each current response or each voltage response for the effect of the capacitances or impedances determined in advance;
       ascertain an occurring phase shift from each adjusted current response or each adjusted voltage response; and derive parameters for a statement about the state of charge or about the state of health of the battery system from the phase shifts.

12. The arrangement of claim 11, wherein the arrangement comprises the AC/DC converter, and
wherein the measurement device is connected on the one side to the DC side of the AC/DC converter.

13. The arrangement of claim 11, wherein the arrangement comprises the DC/DC converter, and
wherein the measurement device is connected on the one side to the DC/DC converter.

14. The arrangement of claim 11, wherein the measurement device is configured to impress the sinusoidal voltage harmonic with varied frequency as the respective measurement signal transmitted to the battery system.

15. The arrangement of claim 11, wherein the measurement device is configured to impress the sinusoidal current with varied frequency as the respective measurement signal transmitted to the battery system.

16. The arrangement of claim 11, wherein the current response is ascertained for each transmitted measurement signal.

17. The arrangement of claim 11, wherein the voltage response is ascertained for each transmitted measurement signal.

* * * * *